US012601782B2

(12) United States Patent
Kim

(10) Patent No.: US 12,601,782 B2
(45) Date of Patent: Apr. 14, 2026

(54) PROBE CARD HOLDER FOR WAFER TESTING

(71) Applicant: UNITEST INC, Yongin-si (KR)

(72) Inventor: Dae Kyoung Kim, Yongin-si (KR)

(73) Assignee: UNITEST INC, Yongin-si (KR)

( * ) Notice: Subject to any disclaimer, the term of this patent is extended or adjusted under 35 U.S.C. 154(b) by 124 days.

(21) Appl. No.: 18/406,329

(22) Filed: Jan. 8, 2024

(65) Prior Publication Data

US 2025/0155496 A1 May 15, 2025

(30) Foreign Application Priority Data

Nov. 15, 2023 (KR) ........................ 10-2023-0157806

(51) Int. Cl.
  G01R 31/28 (2006.01)
  G01R 1/073 (2006.01)
(52) U.S. Cl.
  CPC ......... G01R 31/2891 (2013.01); G01R 1/073 (2013.01)
(58) Field of Classification Search
  CPC .. G01R 31/2808; G01R 31/2886–2893; G01R 1/067–07392; H01L 21/67
  See application file for complete search history.

(56) References Cited

U.S. PATENT DOCUMENTS

2005/0140384 A1    6/2005    Andrews et al.
2007/0115013 A1    5/2007    Andrews et al.
2008/0157796 A1    7/2008    Andrews et al.
2013/0241587 A1    9/2013    Chua et al.
2013/0314115 A1   11/2013    Durbin et al.
2021/0215738 A1    7/2021    Torreiter
2025/0093411 A1*   3/2025    Lou .................... G01R 31/2868

FOREIGN PATENT DOCUMENTS

| CN | 1384922 A | 12/2002 |
|---|---|---|
| JP | 10-31035 A | 2/1998 |
| KR | 10-2010-0130540 A | 12/2010 |
| KR | 10-2012-0104405 A | 9/2012 |
| KR | 10-2021-0105795 A | 8/2021 |
| KR | 10-2023-0060900 A | 5/2023 |
| TW | 200520910 A | 7/2005 |
| TW | 202316118 A | 4/2023 |
| WO | 0104643 A2 | 1/2001 |
| WO | 0104643 A3 | 1/2001 |
| WO | 2005067445 A2 | 7/2005 |
| WO | 2005067445 A3 | 7/2005 |
| WO | 2011-082183 A2 | 7/2011 |
| WO | 2011-082183 A3 | 7/2011 |

* cited by examiner

*Primary Examiner* — Lee E Rodak
*Assistant Examiner* — Jeremiah J Barron
(74) *Attorney, Agent, or Firm* — You & IP, LLC

(57)    ABSTRACT

Proposed is a probe card holder for wafer testing including a first body part (110) provided with a probe card (111) and through guide holes (112) vertically formed around the probe card (111), a second body part (120) provided with a wafer chuck (121) on which a wafer is seated and a magnet holder (122) corresponding to the guide hole (112), a weight ring (130) provided with a magnet chuck (131) that is inserted into the guide hole (112) and fixed with the magnet holder (122) by magnetic force, and assembled with the second body part (120) at a top of the first body part (110), and a clamping part (140) provided between the first body part (110) and the weight ring (130) to hold spacing between the first body part (110) and the weight ring (130).

6 Claims, 5 Drawing Sheets

<u>100</u>

100

100

PROBE CARD HOLDER FOR WAFER TESTING

CROSS REFERENCE TO RELATED APPLICATION

The present application claims priority to Korean Patent Application No. 10-2023-0157806, filed Nov. 15, 2023, the entire contents of which is incorporated herein for all purposes by this reference.

BACKGROUND OF THE INVENTION

Field of the Invention

The present disclosure relates to a probe card holder that fixes a probe card and a wafer together to maintain positions thereof for wafer testing.

Description of the Related Art

In general, semiconductor devices or components, such as integrated circuits (ICs) of a semiconductor device, are fabricated by repeatedly performing a series of processing processes on a wafer. For example, semiconductor devices may be fabricated on a wafer by repeatedly performing the processes that include deposition to form a film on a wafer, etching to create patterns with electrical characteristics on the deposited wafer, ion implantation or diffusion to implant or diffuse impurities into the patterns, and cleaning and rinsing to remove impurities from the wafer on which patterns are formed.

After the semiconductor devices that have undergone this series of processes are fabricated, an electrical testing process may be performed to inspect the electrical properties of the semiconductor devices. The testing process is carried out by means of a probe station containing a probe card with multiple probes and a tester connected to the probe card to provide an electrical signal.

A typical probe station consists of a test chamber, a chuck disposed in the test chamber to support a wafer, a chuck transfer device that drives the chuck, a probe card having a plurality of probes configured to contact semiconductor devices formed on a wafer, and a tester connected to the probe card to perform testing.

In such a conventional probe station, a chuck transfer device transports a chuck on which a wafer is seated to a test chamber, the positions of contact electrodes on the wafer and probes of a probe card are identified by using a vision sensor such as a CCD camera, and on the basis of the identified position information, the chuck transfer device is controlled to bring the contact electrodes of the wafer into contact with the probes to be electrically connected with each other. In an ideal case, a probe station keeps a wafer mounted on a chuck and a probe card in uniform contact with appropriate pressure through overdriving control.

However, in reality, it is very difficult to maintain perfect contact between a wafer mounted on a chuck and a probe card due to mechanical precision errors and disturbances, and even if the chuck is raised to a height corresponding to the predetermined overdrive amount in this state, a certain part of the wafer may be imaged too deeply, causing damage to the wafer, or a certain part of the wafer is not properly imaged, causing an "open fail" in which probes and contact electrodes are not in contact, making normal testing impossible.

The present disclosure, as an alternative to the conventional case, is intended to efficiently test a large number of wafers by breaking away from a conventional wafer testing process, and to perform wafer testing by modularizing a probe card and a wafer into one. To this end, this application discloses a probe card holder that enables a probe card and a wafer to maintain precise positions thereof during a transfer process.

DOCUMENTS OF RELATED ART (Patent Document 0001) Korean Patent Application Publication No. 10-2010-0130540 (published Dec. 13, 2010)

SUMMARY OF THE INVENTION

Accordingly, the present disclosure has been made keeping in mind the above problems occurring in the related art, and the present disclosure is intended to provide a probe card holder for wafer testing that modularizes a probe card and a wafer into one to perform wafer testing and enables the probe card and the wafer to maintain positions thereof.

In order to achieve the above objective, according to an embodiment of the present disclosure, there is provided a probe card holder for wafer testing including: a first body part provided with a probe card in the center thereof and through guide holes vertically formed around the probe card; a second body part provided with a wafer chuck in the center thereof on which a wafer is seated and magnet holders corresponding to the guide holes; a weight ring provided with magnet chucks to be inserted into the guide hole and fixed with the magnet holders by magnetic force, and assembled with the second body part at the top of the first body part; and a clamping part provided between the first body part and the weight ring to hold spacing between the first body part and the weight ring.

Preferably, at least two magnet chucks may be provided at a lower part of the weight ring. More preferably, at least two clamping parts may be provided between the first body part and the weight ring. More preferably, at least one clamping part may be provided between the magnet chucks.

Preferably, the clamping part may include: a shaft with an end thereof fixed to the weight ring or the first body part; and a pneumatic drive part fixed to the weight ring or the first body part and fixed to the based on a pneumatic signal.

Preferably, the probe card holder for wafer testing may further include: a guide member provided between the first body part and the weight ring to guide an assembly position.

A probe card holder for wafer testing according to the present disclosure enables a probe card and a wafer to maintain precise positions thereof by modularizing and integrating the probe card and the wafer. The probe card holder includes: a first body part provided with a probe card in the center thereof and through guide holes vertically formed around the probe card; a second body part provided with a wafer chuck in the center thereof on which a wafer is seated and magnet holders corresponding to the guide holes; a weight ring provided with magnet chucks to be inserted into the guide hole and fixed with the magnet holders by magnetic force, and assembled with the second body part at the top of the first body part; and a clamping part provided between the first body part and the weight ring to hold spacing between the first body part and the weight ring.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

The specific structural and functional descriptions presented in the embodiments of the present disclosure are merely illustrative for the purpose of explaining the embodiments according to the concept of the present disclosure, and the embodiments according to the concept of the present disclosure may be implemented in various forms. In addition, the present disclosure should not be construed as being limited to the embodiments described herein, but should be understood to include all changes, equivalents, and substitutes included in the spirit and technical scope of the present disclosure.

Hereinafter, the present disclosure will be described in detail with reference to the accompanying drawings.

Figure 1:
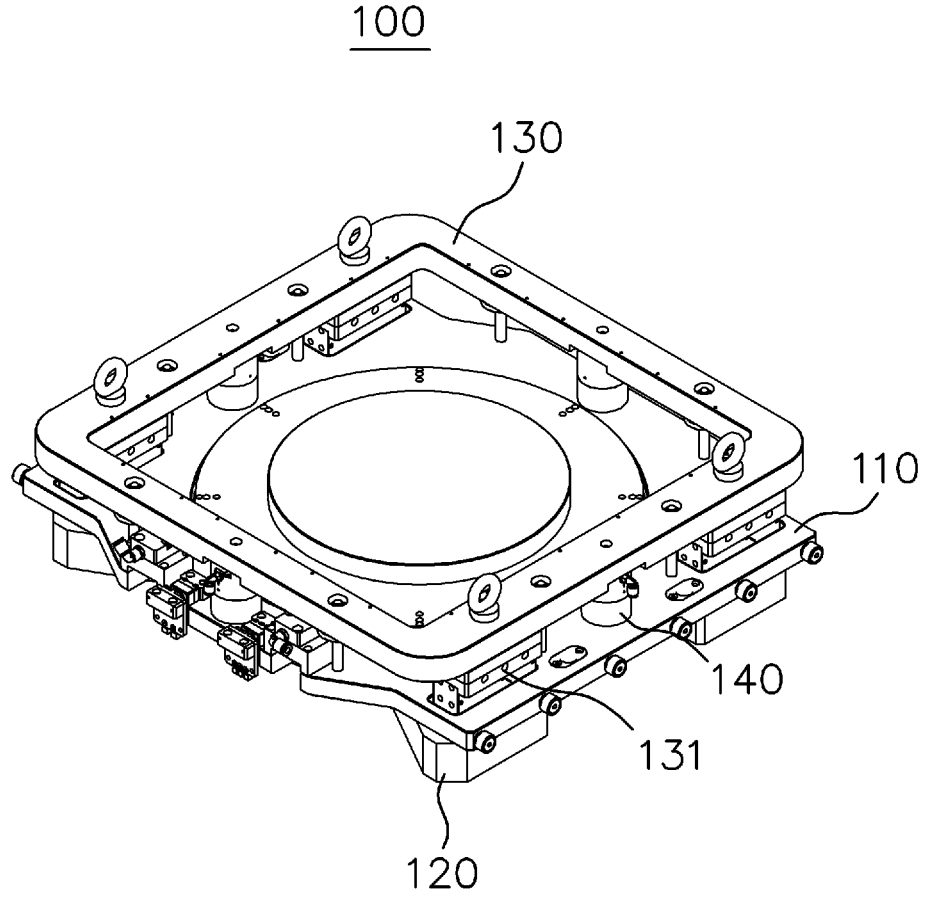
FIG. 1 is a perspective view of a probe card holder for wafer testing according an embodiment of the present disclosure.
Figure 2:
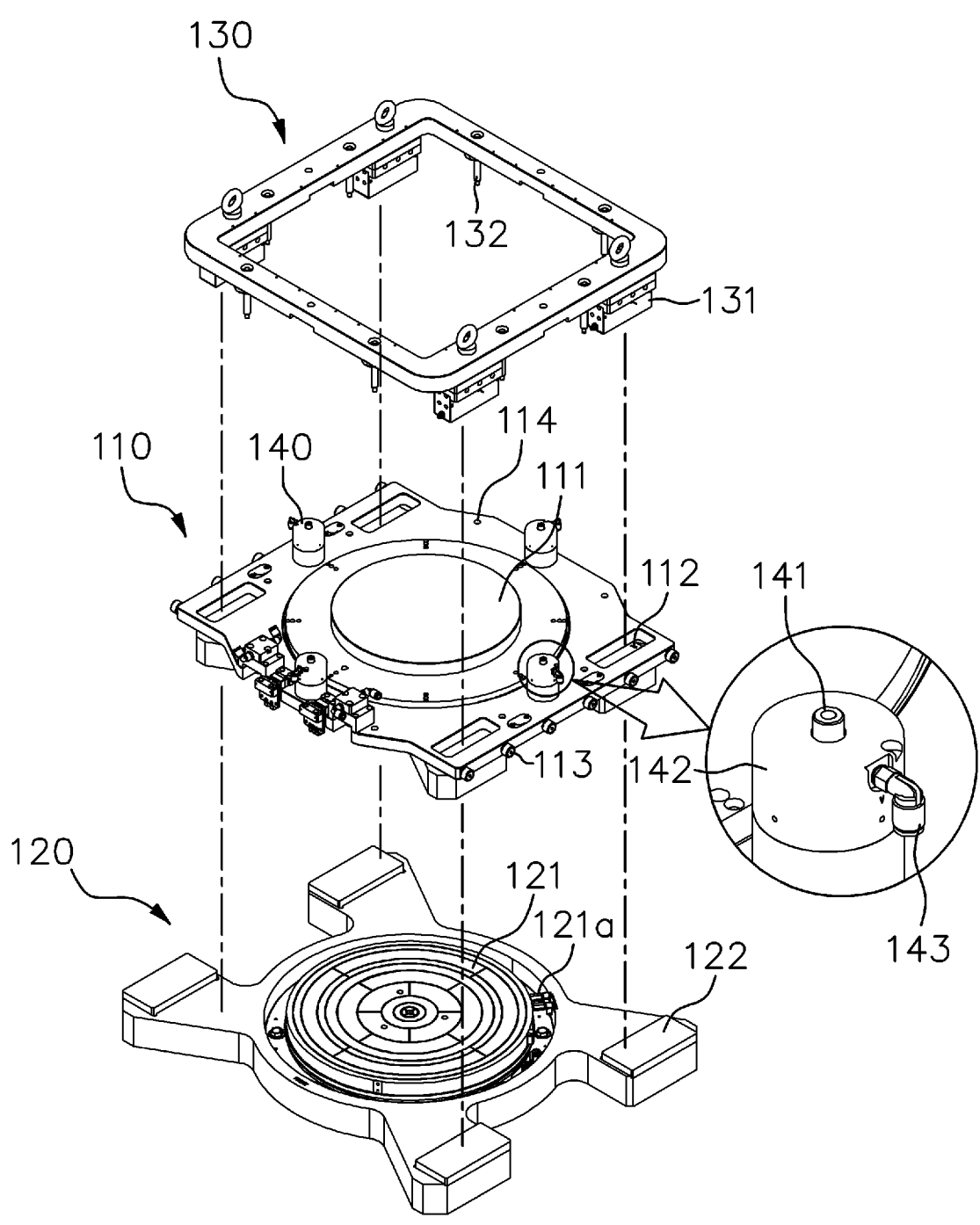
FIG. 2 is an exploded perspective view of a probe card holder for wafer testing according an embodiment of the present disclosure.
Figure 3:
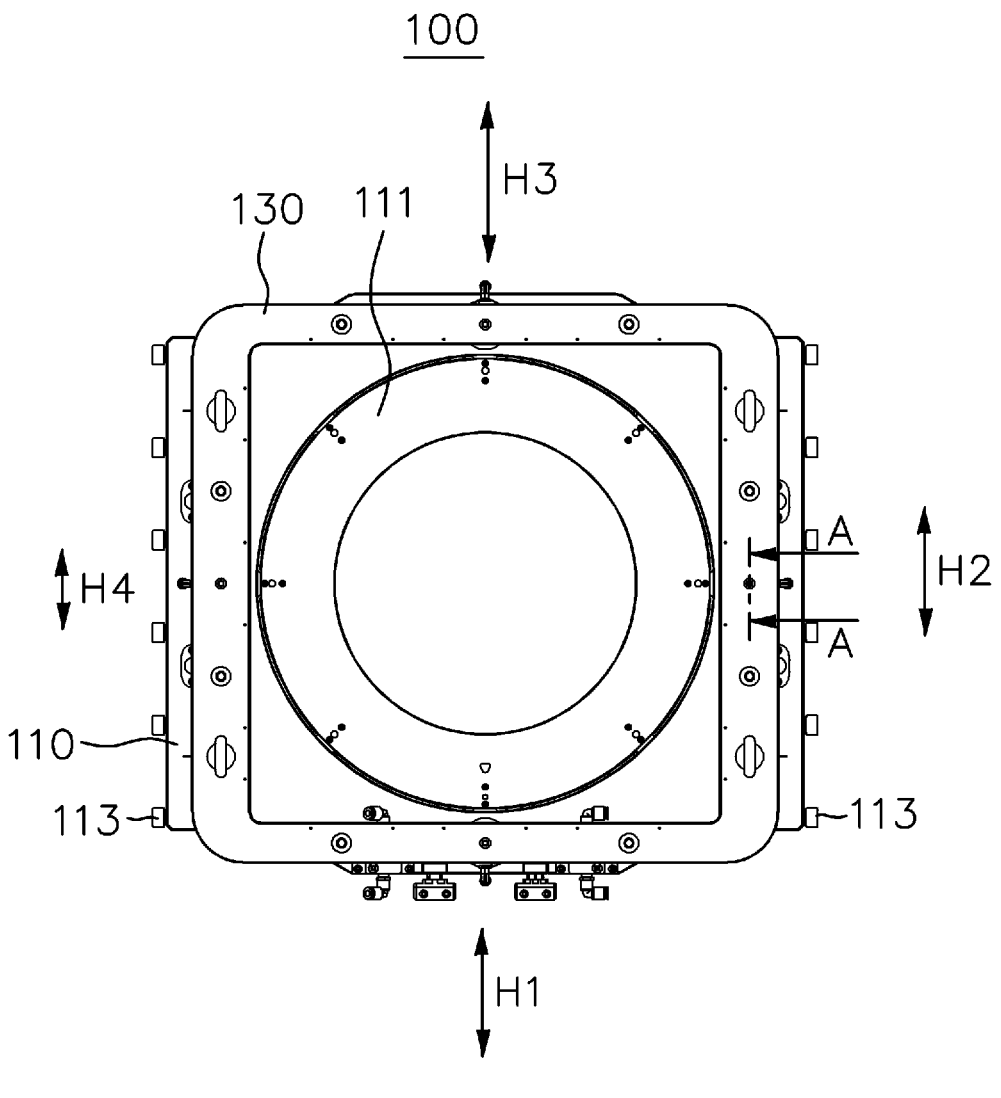
FIG. 3 is a plan view of a probe card holder for wafer testing according an embodiment of the present disclosure.
Figure 4A:
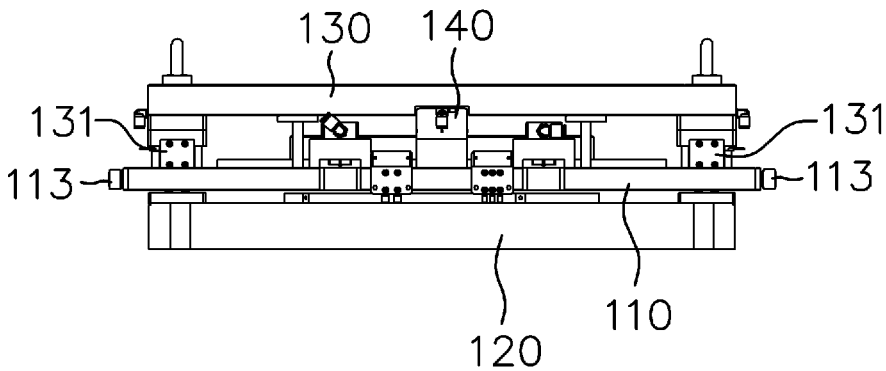
FIGS. 4A and 4B are front and side views of a probe card holder for wafer testing according an embodiment of the present disclosure.
Figure 4B:
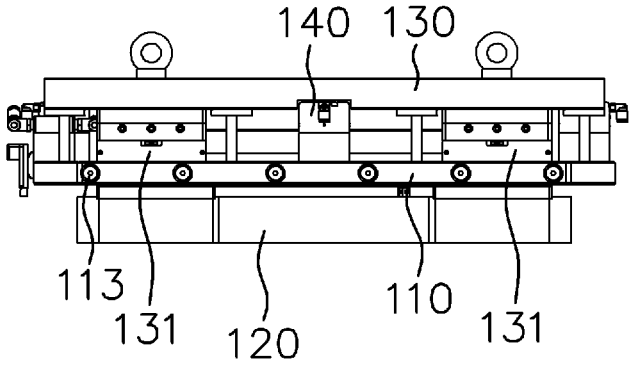

FIG. 1 is a perspective view of a probe card holder for wafer testing according an embodiment of the present disclosure; FIG. 2 is an exploded perspective view of a probe card holder for wafer testing according an embodiment of the present disclosure; FIG. 3 is a plan view of a probe card holder for wafer testing according an embodiment of the present disclosure; and FIGS. 4A and 4B are front and side views of a probe card holder for wafer testing according an embodiment of the present disclosure.

Referring to FIGS. 1 to 4B, a probe card holder for wafer testing 100 (hereinafter also abbreviated as "probe card holder") according an embodiment of the present disclosure includes a first body part 110, a second body part 120, a weight ring 130, and a clamping part 140.

The first body part 110 is provided with a probe card 111 at the center thereof, and through guide holes 112 formed around the probe card 111. In this embodiment, although the first body part 110 is a square member with approximately four sides, and the guide hole 112 is shown to be placed at each of the four corners of the first body part 110, the shape of the first body part and the number and position of the guide holes may be modified in various ways. Preferably, the first body part 110 is formed with at least two guide holes 112.

The first body part 110 may be provided with a plurality of rotatable rollers 113 at opposite ends thereof for transport, and the rollers may be provided as, but are not limited to, cam followers with a low coefficient of friction and excellent rotational performance.

The second body part 120 is provided with a wafer chuck 121 in the center thereof on which a wafer is seated, and is provided with a magnet holders 122 corresponding to the guide holes 112 of the first body part 110. The magnet holder 122 may be made of a known material (for example, a ferromagnetic material) so that an attractive force acts between the magnet chucks 131 and the magnet holder 122 due to magnetic force. In this embodiment, four magnet holders 122 are shown at positions corresponding to the guide holes 112. The wafer chuck 121 is provided with an air fitting 121a to secure the seated wafer by vacuum suction.

The weight ring 130 has a square ring shape and is provided with a magnet chuck 131 at the bottom thereof, and the magnet chuck 131 is provided with the same number corresponding to the magnet holder 122 of the second body part 120. The magnet chuck 131 may be provided as a permanent magnet or an electromagnet, and is preferably provided as a permanent magnet.

Preferably, a plurality of guide pins 132 may be provided at the lower part of the weight ring 130, and a hole 114 is formed on the upper surface of the first body part 110 corresponding to each guide pin 132, so that during an assembly process of the weight ring 130 and the first body part 110, as each guide pin 132 is inserted into the hole 114, the position of the weight ring 130 and the first body part 110 for assembly may be aligned. Meanwhile, in this embodiment, although the guide pin 132 is shown as being provided on the weight ring 130, a plurality of guide pins 132 may be provided in the first body part while a plurality of holes are formed in the weight ring corresponding to each guide pin, and a guide member may further be provided to guide the assembly position of the first body part 110 and the weight ring 130.

The clamping part 140 is provided between the first body part 110 and the weight ring 130 to hold spacing between the first body part 110 and the weight ring 130. Preferably, a plurality of clamping parts 140 are provided between the first body part 110 and the weight ring 130.

The clamping part 140 includes: a shaft 141 whose upper end is fixed to the lower part of the weight ring 130; and a pneumatic drive part 142 that is fixed to the first body part 110 and fixes the shaft 141 by a pneumatic signal. Reference numeral 143 is an air fitting for supplying pneumatic pressure.

Figure 5:
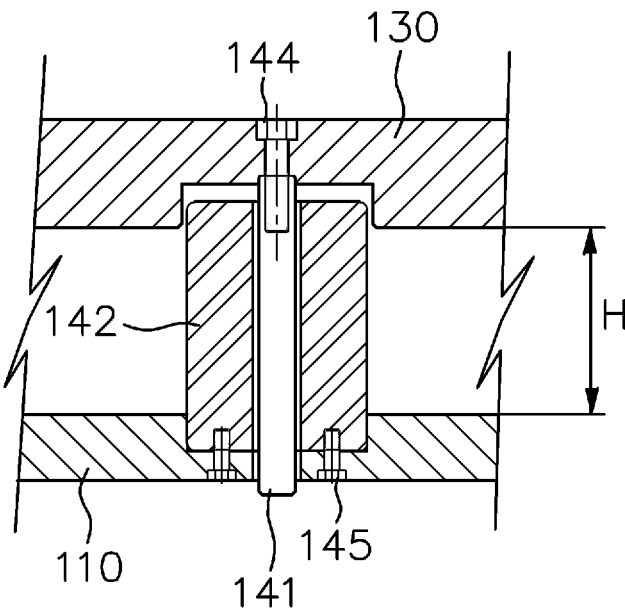
FIG. 5 is a cross-sectional view taken along line A-A in FIG. 3.

FIG. 5 is a cross-sectional view taken along line A-A in FIG. 3. To facilitate understanding, only the first body part, the weight ring, and the clamping part are shown, and the sizes and proportions of the components are exaggerated.

Referring to FIG. 5, the clamping part 140 includes the shaft 141 whose upper end is fixed by the weight ring 130 and a first bolt 144, and the pneumatic drive part 142 whose lower end is fixed by the first body part 110 and a second bolt 145 to secure the shaft 141. Depending on the pneumatic signal applied to the pneumatic drive part 142, the shaft 141 moves up and down within the pneumatic drive part 142 or the position (height) of the shaft 141 is fixed.

Preferably, the pneumatic drive part 142 is a clamping mechanism in a normal close (NC) state, the shaft 141 may move up and down in the pneumatic drive part 142 while a pneumatic signal is applied to the pneumatic drive part 142. On the other hand, when a pneumatic signal is not applied to the pneumatic drive part 142, the shaft 141 is fixed by the pneumatic drive part 142 and the spacing between the first body part 110 and the weight ring 130 is fixed.

The clamping part 140 may be provided as a clamping mechanism of the RBPS series sold as a "clamping and braking element" by Zimmer, but is not limited thereto.

In the probe card holder 100 of the present disclosure configured as described above, a wafer (not shown) is placed on the wafer chuck 121, the first body part 110 and the weight ring 130 are stacked and assembled on the top of the second body part 120, and as the magnet chucks 131 and the magnet holders 122 are fixed by magnetic force, the first body part 110, the second body part 120, and the weight ring 130 are fixed to each other. Meanwhile, during the assembly process of the first body part 110, the second body part 120, and the weight ring 130, a pneumatic signal is applied to the clamping part 140, so that the shaft 141 moves up and down in the pneumatic drive part 142. Thereafter, when the pneumatic pressure supplied to the clamping part 140 is finally cut off, the spacing between the first body part 110 and the weight ring 130 is fixed by the clamping part 140, and the positions of the wafer and the probe card may be fixed.

In this way, the probe card and the wafer may be modularized and transported with positions thereof precisely maintained by the probe card holder 100, and may be transferred to a testing chamber and tested.

In FIG. 3, the spacing (H1-H4) at each position between the first body part 110 and the weight ring 130 fixed by four clamping parts is shown by arrows as an example. To facilitate understanding, the spacing (H1-H4) at each position is exaggerated, and according to the present disclosure, by employing a magnetic chuck and a clamping part using a pneumatic signal, clamping is possible by precisely maintaining the spacing within a precise range of less than 10 μm not only in the horizontal state (H1=H2=H3=H4) but also in the tilted state (H1≠H2≠H3≠H4).

Meanwhile, in the embodiment of the present disclosure, although the explanation was given as an example of a probe card holder with 4 magnet chucks and 4 clamping parts, depending on the size of a wafer, the arrangement and number of magnet chucks and clamping parts may vary.

The present disclosure described above is not limited to the above-described embodiments and the attached drawings, and it will be clear to those skilled in the art that various substitutions, modifications, and changes are possible without departing from the technical spirit of the present disclosure.

What is claimed is:

1. A probe card holder for wafer testing, comprising:
   a first body part provided with a probe card in a center thereof and through guide holes vertically formed around the probe card;
   a second body part provided with a wafer chuck in a center thereof on which a wafer is seated and magnet holders corresponding to the guide holes;
   a weight ring provided with magnet chucks to be inserted into the guide hole and fixed with the magnet holders by magnetic force, and assembled with the second body part at a top of the first body part; and
   a clamping part provided between the first body part and the weight ring to hold spacing between the first body part and the weight ring.

2. The probe card holder for wafer testing of claim 1, wherein at least two magnet chucks are provided at a lower part of the weight ring.

3. The probe card holder for wafer testing of claim 2, wherein at least two clamping parts are provided between the first body part and the weight ring.

4. The probe card holder for wafer testing of claim 3, wherein at least one clamping part is provided between the magnet chucks.

5. The probe card holder for wafer testing of claim 1, wherein the clamping part comprises:
   a shaft with an end thereof fixed to the weight ring or the first body part; and
   a pneumatic drive part fixed to the weight ring or the first body part and fixed to the shaft based on a pneumatic signal.

6. The probe card holder for wafer testing of claim 1, further comprising:
   a guide member provided between the first body part and the weight ring to guide an assembly position therebetween.

* * * * *